United States Patent [19]

Nishiura

[11] Patent Number: 4,920,392
[45] Date of Patent: Apr. 24, 1990

[54] COMPLEMENTARY FIELD EFFECT TRANSISTOR AND METHOD OF FORMING THE SAME

[75] Inventor: Masaharu Nishiura, Matsumoto, Japan

[73] Assignee: Fuji Electric Co., Ltd., Kawasaki, Japan

[21] Appl. No.: 122,114

[22] Filed: Nov. 18, 1987

[30] Foreign Application Priority Data

Nov. 20, 1986 [JP] Japan .................. 61-277434

[51] Int. Cl.⁵ ............................................ H01L 29/72
[52] U.S. Cl. ...................................... 357/23.7; 357/42; 357/4
[58] Field of Search .............................. 357/4, 23.7, 42

[56] References Cited

U.S. PATENT DOCUMENTS 3,378,783  4/1968  Gibson ................................ 357/42
4,686,553  8/1987  Possin ............................... 357/23.7

OTHER PUBLICATIONS

Weimer, Paul K., "The TFT-A New Thin-Film Transistor", Proceedings of the IRE, Jun. 1962, pp. 1462-1468.

Primary Examiner—Andrew J. James
Assistant Examiner—David L. Soltz
Attorney, Agent, or Firm—Brumbaugh, Graves, Donohue & Raymond

[57] ABSTRACT

There is provided a complementary field effect transistor which includes an insulating substrate having a gate electrode formed thereon, a substantially intrinsic semiconductor thin film covering the insulating substrate such that the gate electrode is formed through the insulating substrate at one side of the intrinsic semiconductor thin film, an island p-type semiconductor thin film and an island n-type semiconductor thin film formed over the intrinsic semiconductor thin film, a first pair of electrodes formed over the p-type semiconductor thin film opposite the gate electrode, and a second pair of electrodes formed over the n-type semiconductor thin film, also, opposite the gate electrode on a same side of the intrinsic semiconductor thin film as the first pair of electrodes. A first electrode of each of the first and second pairs of electrodes are electrically connected with each other to form the complementary field effect transistor.

4 Claims, 5 Drawing Sheets (a)

(b)

COMPLEMENTARY FIELD EFFECT TRANSISTOR AND METHOD OF FORMING THE SAME

BACKGROUND OF THE INVENTION

The present invention relates to complementary field effect transistors and in particular to a complementary field effect transistor which is integrated by connecting a p-channel field effect transistor and an n-channel field effect transistor and to using thin film semiconductors in a method of manufacture thereof.

A CMOS complementary field effect transistor, in which a p-channel MOSFET and an n-channel MOSFET are integrated on a single silicon substrate, is well known in the art. FIG. 2 shows this structure in which a n-type silicon substrate 11 is formed with a p-well layer 12 and in which n+ source and drain diffusion layers 13 are formed in the p-well layer whereas p+ source and drain diffusion layers 14 are formed in the other portion. This CMOS construction is frequently used in logical operation circuits, however, it is deficient in that it requires a large number of fabrication steps and has a resultant high fabrication cost. Thus, it is desired to manufacture a number of complementary field effect transistors simultaneously, from an inexpensive substrate of large area using a thin film transistor technique.

It is therefore an object of the present invention to provide a complementary field effect transistor formed from a semi-conductor thin film in order to overcome the aforementioned drawbacks of conventional transistor manufacturing techniques.

SUMMARY OF THE INVENTION

In order to achieve the above-specified object, according to the present invention, there is provided a complementary field effect transistor which includes an insulating substrate having a gate electrode formed thereon, a substantially intrinsic semiconductor thin film covering the insulating substrate such that the gate electrode is formed through the insulating substrate at one side of the intrinsic semiconductor thin film, an island p-type semiconductor thin film and an island n-type semiconductor thin film formed over the intrinsic semiconductor thin film, a first pair of electrodes formed over the p-type semiconductor thin film opposite the gate electrode, and a second pair of electrodes formed over the n-type semiconductor thin film also opposite the gate electrode on a same side of the intrinsic semiconductor thin film as the first pair of electrodes. A first electrode of each of the first and second pairs of electrodes are electrically connected with each other to form to complementary field effect transistor. For a better understanding of the invention, as well as other objects and further features thereof, reference is made to the following detailed description of the preferred embodiments taken in conjunction with the accompanying drawings.

BRIEF DESCRIPTION OF THE DRAWINGS

FIGS. 3(a)–3(e) show sequentially the steps of fabricating the semiconductor device of FIG. 1;

DETAILED DESCRIPTION OF THE PREFERRED EMBODIMENTS

Figures 1, 2, 3:
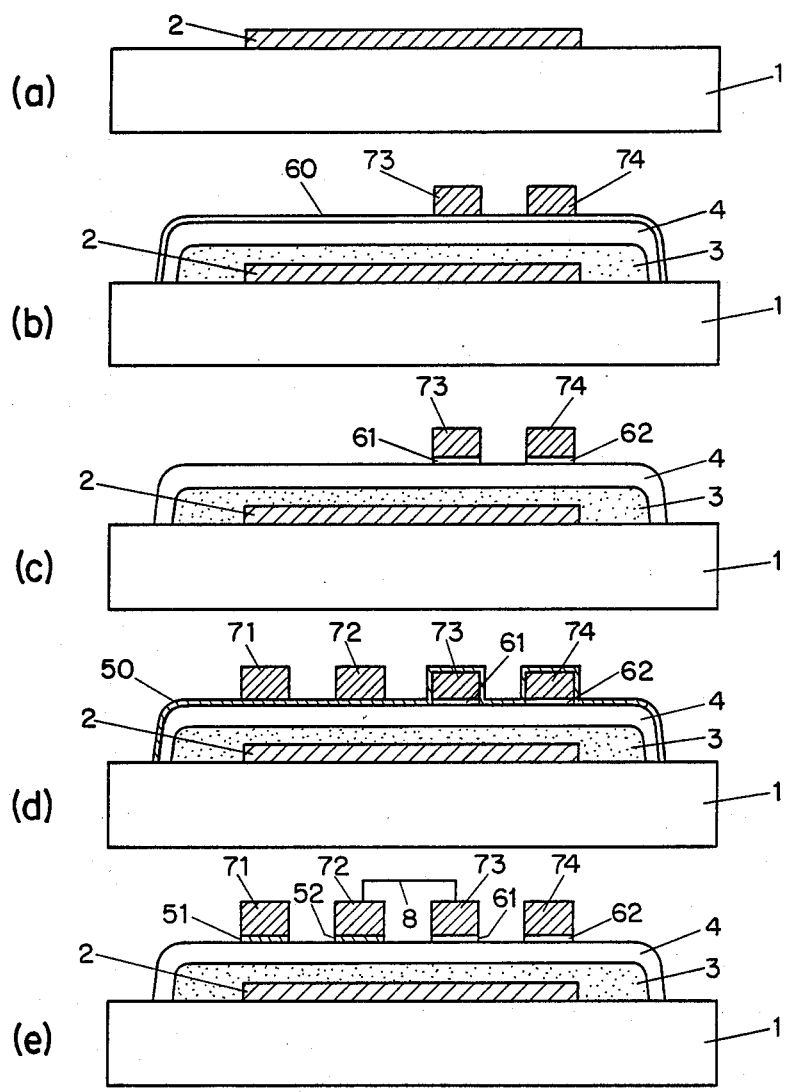
FIG. 1 is an elevational view showing a first embodiment of the present invention.
FIG. 2 shows a CMOS field effect transistor of the prior art.

FIG. 1 shows one embodiment of the present invention wherein an insulating substrate 1 is covered with a gate electrode 2, which in turn is covered with a substantially intrinsic semiconductor thin film 4 made of Si, CdS, amorphous tellurium or the like through an insulating film 3 of silicon oxide, silicon nitride or the like. There are formed on the semiconductor thin film 4 over the gate electrode 2 p-type semiconductor films 51 and 52 and n-type semiconductor films 61 and 62 which are overlaid by metal electrodes 71, 72, 73 and 74. Of these, the electrodes 72 and 73 are connected by a lead wire 8.

FIGS. 3 (a) to (e) show the steps of fabricating the structure shown in FIG. 1. At first, the insulating substrate 1 of glass or the like is formed (as shown at (a)) thereon with the gate electrode 2 of Cr or another metal or ITO by evaporation. The pattern of this gate electrode 2 may be formed by using either a metal mask for evaporation or photolithography techniques.

Next, an insulating film 3 of SiN is deposited to have a thickness of 1,000 to 5,000 Å on the gate electrode 2 by decomposing the mixed gas, which is composed of $NH_3$ gases and $SiH_4$ gases at 2:1 to 10:1, by glow discharge in a vacuum of 1 to 10 Torrs. Next, the a-Si film 4 is laminated to have a thickness of 100 Å to 1 μm by decomposing the $SiH_4$ gases by glow discharge. The ON/OFF ratio could be improved by mixing 1 to 100 ppm of diborane ($B_2H_6$) into the $SiH_4$ gases. Subsequently, an n-type a-Si film 60 is deposited to have a thickness of 200 to 500 Å by decomposing a mixture containing 1% of phosphine ($PH_3$) in the $SiH_4$ gases by glow discharge. The insulating film 3, a-Si film 4, and n-type a-Si film 60 can be sequentially laminated by switching the gases. For these patterns, the metal mask is used in the case of a coarse pattern, and photolithography is used in the case of a fine pattern. In the latter case, the a-Si film 4 or 60 or the SiN film 3 is etched by applying and patterning a photoresist in a desired shape and by glow-discharging the $SF_6$ gases under 0.1 to 2 Torrs. Next, the metal electrodes 73 and 74 are formed (as shown at (b)) by sputtering Cr. After forming these Cr electrodes, the n-type a-Si film 60 is etched (as shown at (c)) to leave the n-type a-Si films 61 and 62 exclusively below the metal electrodes 73 and 74 by plasma-etching using the $SF_6$ gases for 10 to 20 seconds.

A p-type a-Si film 50 is then formed at a thickness of 200 to 500 Å by glow-discharging to decompose the mixture containing about 1% of diborane ($B_2H_6$) in the $SiH_4$ gases. A Cr film is formed (as shown at (d)) at a thickness of 1,000 to 5,000 Å on the a-Si film 50 by sputtering so as to form the metal electrode patterns 71 and 72.

After this, the p-type a-Si film 50 is etched (as shown at (e)) by plasma etching using the $SF_6$ gases for 10 to 20 seconds, to leave the p-type a-Si films 51 and 52 exclusively below the metal electrodes 71 and 72.

Figure 4:
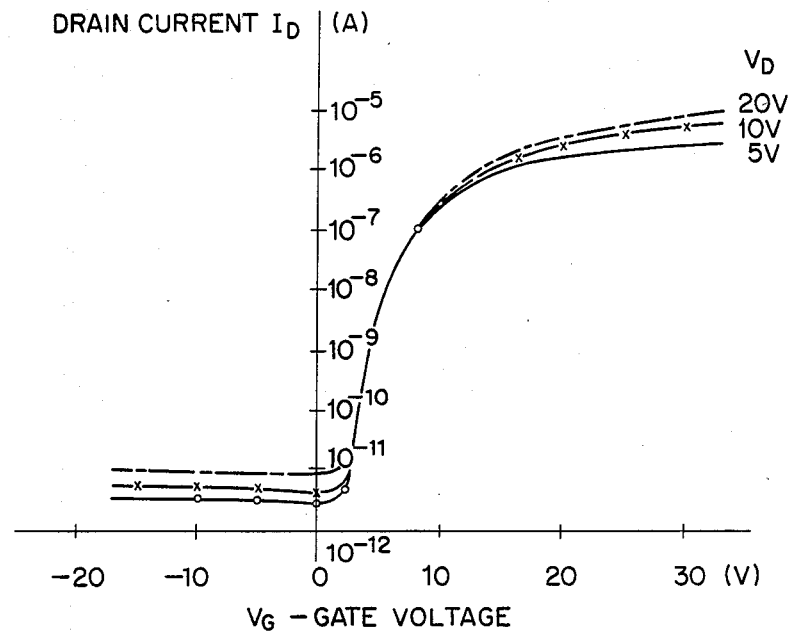
FIGS. 4 and 5 present characteristic curves of a single thin film field effect transistor.
Figure 5:
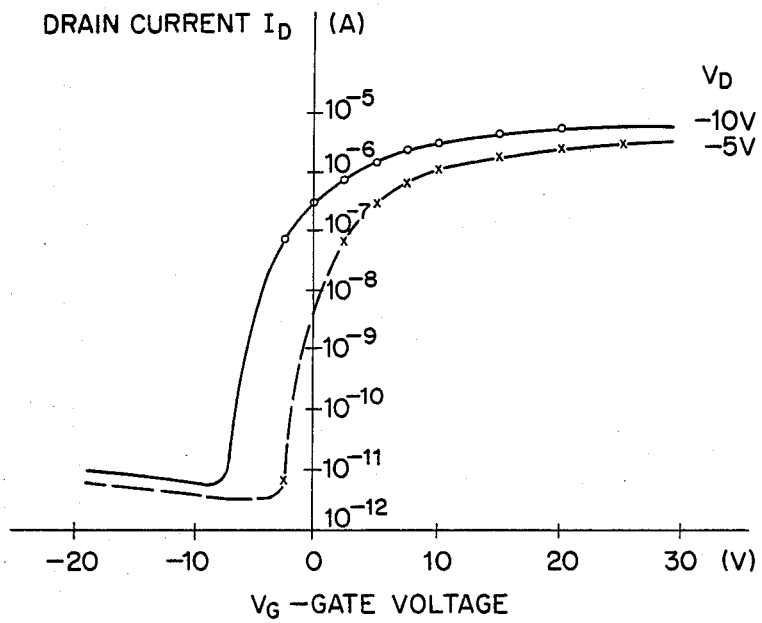

Of the two field effect transistors thus formed, the n-channel field effect transistor formed between the gate electrode 2 and the electrodes 73 and 74 has the characteristics shown in FIG. 4. FIG. 4 shows a plot of drain current $I_D$ versus gate voltage $V_G$ applied to the gate electrode 2 for three different values of drain voltage $V_D$ applied to the drain electrode 74 as a parameter. The drain current is plotted in FIG. 5 for the case in which the voltage $V_D$ of this transistor is negative with respect to the source potential. However, in FIG. 5 the direction of current flow is reversed from that of FIG. 4. The gate voltage $V_G$ is also with reference to the source potential. In this case, the drain current $I_D$ is not in the OFF state even when the gate voltage $V_G=0$, as is different from FIG. 4. The various examinations of this point have revealed that the field effect transistor operation in FIG. 5 is characterized to have drain current flow corresponding to an effective gate voltage of $V_G-V_D$ in FIG. 4. In other words, the field effect transistor is operating under the gate voltage which is reduced with reference to the lower one of the source and drain potentials.

The p-channel field effect transistor formed between the gate electrode 2 and the electrodes 71 and 72 exhibits operating characteristics similar to those of the foregoing n-channel field effect transistor as if the voltages were inverted.

The electrodes 72 and 73 of the two transistors are connected by the lead wire 8 and used as an output, which was shown to generate an output potential of 0 V when the electrode 74 was earthed to the ground and when voltages of 10 V and +10 V were applied to the electrode 71 and the gate electrode 2, respectively. On the other hand, an output voltage of 10 V was generated when the gate voltage was at 0 V. These were the inverter operating characteristics of a complementary thin film transistor.

Figure 6:
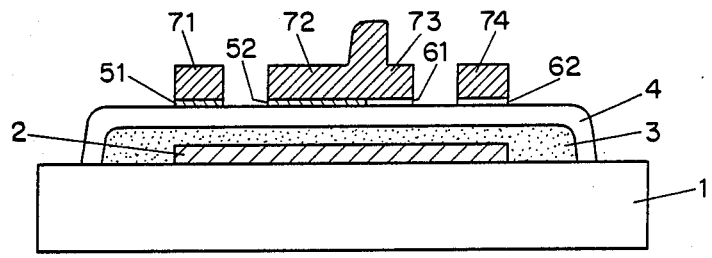
FIG. 6 is an elevational view showing a second embodiment of the present invention.
Figure 7:
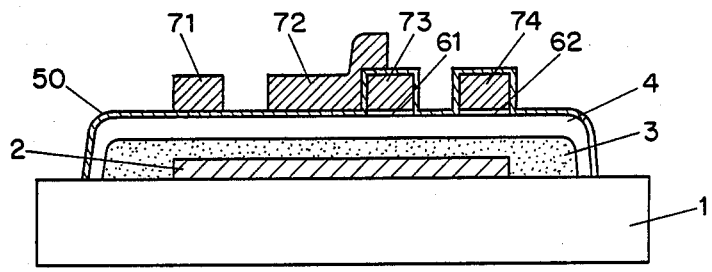
FIG. 7 is a section showing one step of fabricating the second embodiment of FIG. 6.

FIG. 6 shows a second embodiment of the present invention, in which the common portions shared with the first embodiment are denoted with common reference numerals. FIG. 7 shows such a portion corresponding to FIG. 3 (d) as it relates to the steps of fabricating the second embodiment. Specifically, the electrode 72 is formed over the metal electrode 73. Next, the p-type layer is removed by a similar method except for the portions of the electrodes 71 and 72. Thus, the electrodes 72 and 73 are automatically connected. The second embodiment exhibits the characteristics similar to those of the first embodiment as a complementary thin film transistor.

Figure 8:
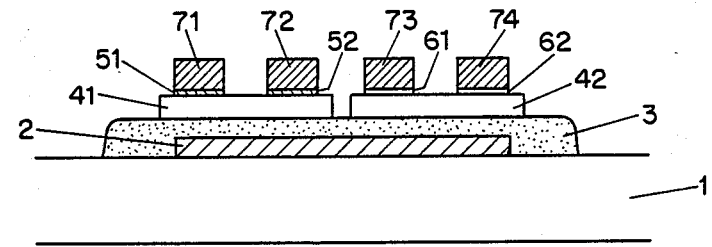
FIG. 8 shows a modified example of the first embodiment of the present invention.
Figure 9:
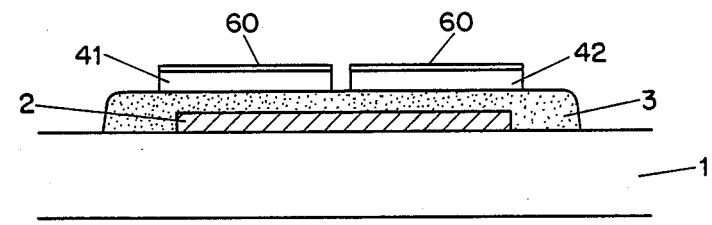
FIGS. 9(a) and 9(b) present two steps of fabricating the modified example of FIG. 8.
Figure 9:
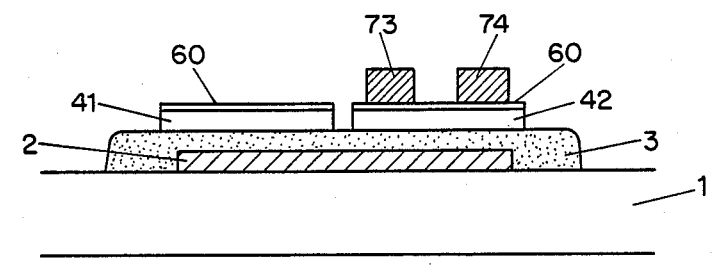

A modified example of the first embodiment is shown in FIG. 8. FIG. 9 shows such a portion of the steps of fabricating the modified example as is different from those of FIG. 3. This modification is characterized in that the non-doped common a-Si layer 4 of the individual transistors is cut to form a-Si layers 41 and 42 in the individual transistors. For this formation, the step of FIG. 3 (a) is followed by the step of FIG. 9(a). This additional step is to pattern the non-doped a-Si layer 4 and the n-type a-Si layer 60 to form the layers 41 and 42. Next, the process transfers to the step of FIG. 9(b), at which the metal electrode patterns 73 and 74 of Cr or the like are formed on the a-Si layer 42. The subsequent steps are similar to those of FIG. 3 (c), (d) and (e), and this embodiment is similar to the first embodiment in that the inverter operations are effected by the potential applied to the gate electrode 2 by connecting the electrodes 72 and 73 by terminal 8 and by setting electrode 74 at ground potential and electrode 71 at $V_{DD}$.

Incidentally, at the preceding steps, the n-type film 60 was formed at first on the intrinsic a-Si films 4, 41 and 42. However, no difference was perceived even when the order of forming the p-type layer and the n-type layer was changed to first form the p-type layer 50.

Figure 10:
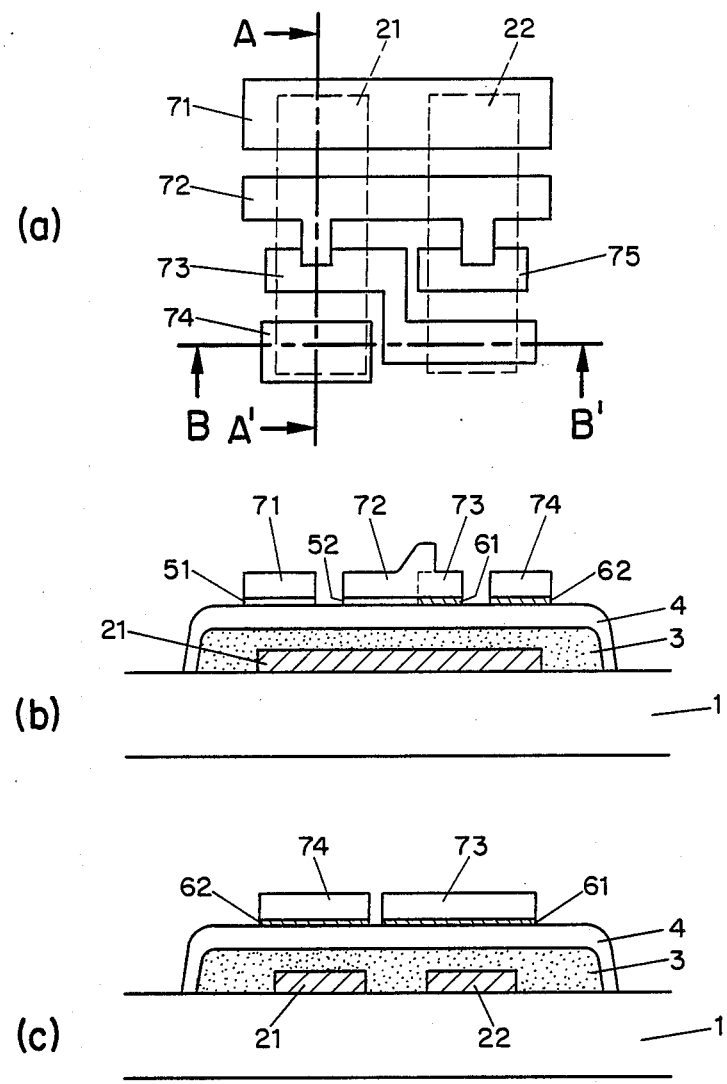
FIGS. 10a–10c shows a third embodiment of the present invention, of which (a) is a top plan view and (b) and (c) are sections taken along lines A-A' and B-B' of FIG. 10(a), respectively.

A third embodiment of the present invention is shown in FIG. 10, in which: (a) is a top plan view; (b) is a section taken along line A-A' of (a); and (c) is a section taken along line B-B'. The common portions shared with those of FIG. 1 are denoted with identical reference numerals. In this embodiment, metal electrodes (or gate electrodes) 21 and 22 are formed on the substrate 1 of glass or the like, as shown in broken lines in FIG. 10(a). On the electrodes 21 and 22, there are sequentially formed insulating film 3 of SiN or the like, the non-doped a-Si film 4 and the n-type a-Si films 61 and 62. Patterns 73, 74 and 75 are further formed of metal electrodes of Cr or the like. The electrode pattern 73 is formed across the gate electrodes 21 and 22. These gate electrodes are used as masks to etch the n-type film. and the p-type film is formed together with the metal electrode patterns 71 and 72, as shown. The electrode 72 is overlaid on the electrodes 73 and 74 to electrically connect them. Next, this electrode pattern is used as a mask to etch the p-type film.

Figure 11:
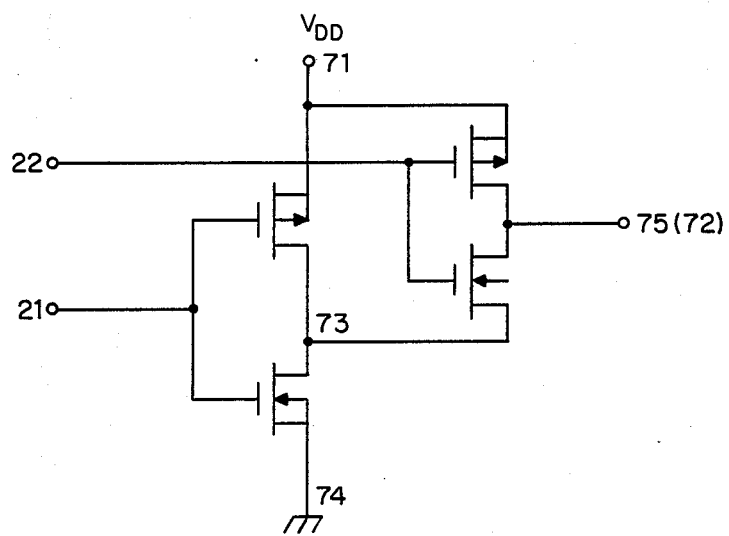
FIGS. 11 and 12 are diagrams showing equivalent circuits of the third embodiment of FIG. 10.
Figure 12:
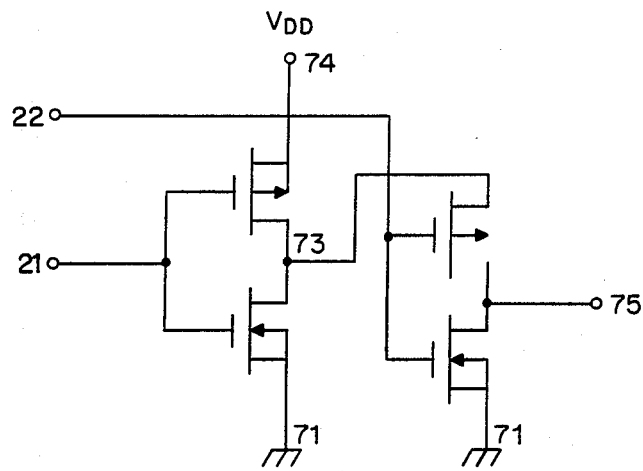

An equivalent circuit to this semiconductor device is shown in FIG. 11 in which the corresponding portions are denoted with the reference numerals of FIG. 10. The electrode 71 is supplied with the voltage $V_{DD}$ of about 10 V; the electrode 74 is earthed to ground potential; and the electrode 75 provides an output. If the two gate electrodes 21 and 22 are used as inputs, a 2-output NAND circuit can be made. If, moreover, the n-type layer and the p-type layer are formed in the reversed order, the electrode 71 is earthed to the ground, the electrode 75 is used as an output and the electrode 74 is set at the voltage $V_{DD}$, a NOR circuit using the electrodes 21 and 22 as its input can be constructed, as shown in FIG. 12.

Figure 13:
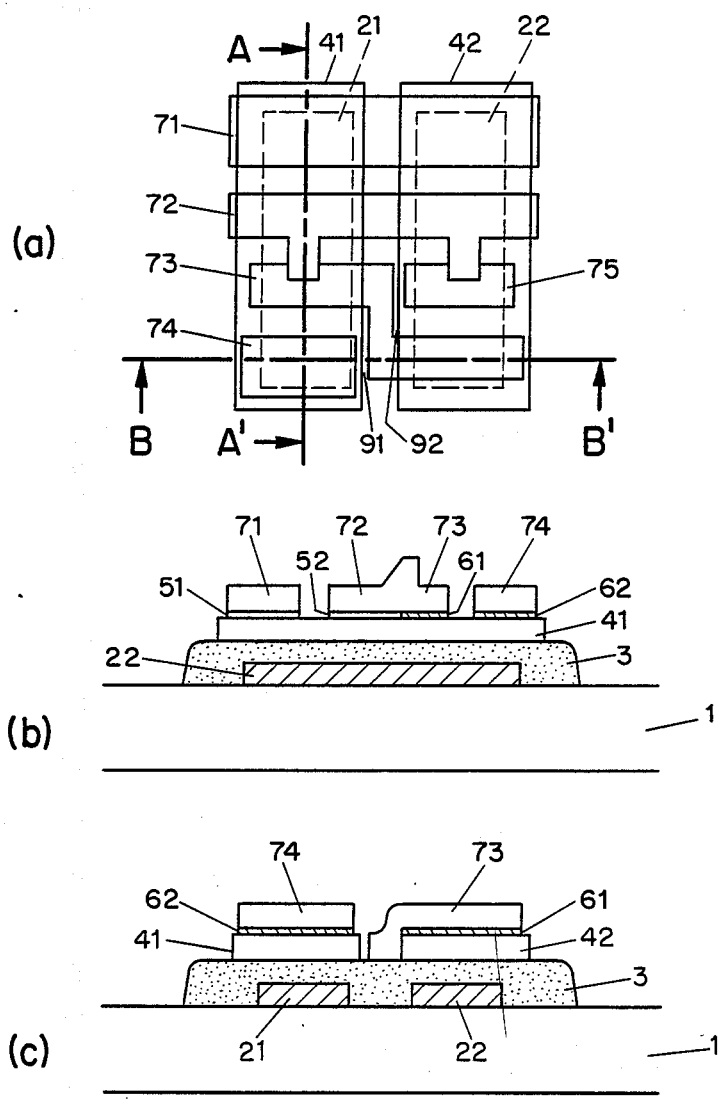
FIGS. 13a–13c shows a fourth embodiment of the present invention, of which (a) is a top plan view and (b) and (c) are sections taken along lines A-A' and B-B' of FIG. 13(a), respectively.

A fourth embodiment of the present invention is shown in FIG. 13, in which: (a) is a top plan view; (b) is a section taken along line A-A'; and (c) is a section taken along line B-B'.

This semiconductor device is formed with the metal electrodes (or gate electrodes) 21 and 22 on the glass substrate 1, as shown in broken lines in FIG. 13(a). There are further formed sequentially insulating film 3 of SiN or the like, the non-doped a-Si film 4, and the n-type a-Si film. After this, the non-doped a-Si film 4 and the n-type a-Si film are patterned into the shapes shown by the non-doped a-Si films 41 and 42. The subsequent steps follow similar ones of the third embodiment described hereinabove. As a result, it is possible to form a semiconductor device having a low leakage current in either case where the gap 91 between the electrodes 73 and 74 or the gap 92 between the electrodes 73 and 75 is small. This makes it easy to form the element of a NAND gate with a small pattern.

It is easily seen that, according to the present invention, a complementary field effect transistor can be fabricated of a semiconductor thin film by forming a gate electrode through an insulating film at one side of a substantially intrinsic semiconductor thin film, by forming two source/drain electrodes on island p-type semiconductor thin films and two source/drain electrodes on island n-type semiconductor thin films in regions disposed on the other side opposed to the gate electrode, and by connecting the electrodes on the adjoining two of the p-type semiconductor thin films and the n-type semiconductor thin films. Because of a large drive current, the complementary field effect transistor can be effected to have high-speed operation. Moreover, a number of complementary field effect transistors can be fabricated with a simple pattern on the common semiconductor thin film over an inexpensive, wide substrate. Moreover, since the cost for the materials is low and since no well layer has to be formed, as is different from the CMOS field effect transistor of the prior art, the complementary field effect transistor of the present invention is advantageous in that it can be fabricated at a low cost. The detailed description of the preferred embodiment of the invention having been set forth herein for the purpose of explaining principles thereof, it is known that there may be modifications, variation or change in the invention without departing from the proper scope of the invention and the claims thereto.

I claim:

1. A complementary field effect transistor device comprising:
    an insulating substrate having a gate electrode formed on a major surface thereof;
    an insulating film covering said gate electrode and the area surrounding said gate electrode;
    a substantially intrinsic semiconductor thin film covering said insulating film;
    first and second islands of semiconductor thin film of one conductivity type formed over said intrinsic semiconductor thin film in a first paired relationship and positioned to both overlie a first region of said gate electrode, and first and second islands of semiconductor thin film of opposite conductivity type formed over said intrinsic semiconductor thin film in a second paired relationship and positioned to both overlie a second region of said gate electrode, one of the islands formed of said one conductivity type film being paired with one of the islands formed of said opposite conductivity film;
    electrodes formed over the surface of each island formed of said opposite conductivity type semiconductor thin film opposite said gate electrode; and
    electrodes formed over the surface of each island formed of said one conductivity type semiconductor thin film opposite said gate electrode on the same side of said intrinsic semiconductor thin film as the electrodes formed over the islands formed of said opposite conductivity type semiconductor thin film such that the electrode formed over said first island of said opposite conductivity type thin film and the electrode formed over said first island of said one conductivity type thin film are electrically connected with each other thereby to form a complementary fielded effect transistor.

2. The complementary field effect transistor device according to claim 1, wherein said electrically connected electrodes are formed one on top of the other.

3. The complementary field effect transistor device according to claim 1, wherein said intrinsic semiconductor thin film is formed in first and second separated portions, said first portion being formed below said first and second islands formed of said opposite conductivity type semiconductor thin film and said second portion being formed below said first and second islands formed of said one conductivity type semiconductor thin film.

4. The complementary field effect transistor device according to claim 1, wherein said first and second regions of said gate electrode are disposed in spaced apart side-by-side relationship, and
    wherein said electrode formed over said second island of said opposite conductivity type semiconductor thin film is formed over each of the electrodes formed over said first island of said opposite conductivity type thin film and over said first island of said one conductivity type thin film to electrically connect them.

* * * * *